(12) United States Patent
Belhaj (10) Patent No.: US 7,030,858 B1
(45) Date of Patent: Apr. 18, 2006

(54) BI-DIRECTIONAL SCAN SWITCH MATRIX METHOD AND APPARATUS

(75) Inventor: Said O. Belhaj, Coplay, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/428,468

(22) Filed: Oct. 28, 1999

(51) Int. Cl.
*G09G 5/00* (2006.01)

(52) U.S. Cl. .................................. 345/168; 341/22

(58) Field of Classification Search ........ 345/168–172, 345/173; 341/22–34
See application file for complete search history.

(56) References Cited

U.S. PATENT DOCUMENTS

| | | | | |
|---|---|---|---|---|
| 4,138,917 A | * | 2/1979 | Sakashita et al. | 84/618 |
| 4,266,213 A | * | 5/1981 | Renschke | 341/26 |
| 4,673,933 A | * | 6/1987 | Bauer | 341/22 |
| 5,677,687 A | * | 10/1997 | Valdenaire | 341/26 |
| 6,417,787 B1 | * | 7/2002 | Hsu | 341/26 |

FOREIGN PATENT DOCUMENTS

| | | | |
|---|---|---|---|
| DE | 0 441 129 A1 | | 8/1991 |
| JP | 356027438 A | * | 3/1981 |
| JP | 404026226 A | * | 1/1992 |

OTHER PUBLICATIONS

English abstract of Fuldner et al., EP 0441129A1 (original previously cited).*

* cited by examiner

*Primary Examiner*—Dennis-Doon Chow (57) ABSTRACT

A flexible and efficient apparatus and method of scanning switch matrix usable in user interface devices, e.g., a keypad or the like, having a number of switching elements, e.g., push buttons and/or switches, up to a twice the product of the number of rows and the number of columns. Each row and columns of the switch matrix are capable of being driven and being monitored during a scanning of the switch matrix for a presence of a closure of a switching element. The switch matrix device and the scanning method also allows integration of one or more switches in the switch matrix without the need for additional detection mechanisms dedicated to the switches.

21 Claims, 6 Drawing Sheets

Figure 1: Re-Mapped Keypad Matrix

Figure 2: Re-Mapped Keypad/Switch Matrix

BI-DIRECTIONAL SCAN SWITCH MATRIX METHOD AND APPARATUS

BACKGROUND OF THE INVENTION

1. Field of the Invention

This invention relates to electronic input devices. More particularly, it relates to a multi-element switch matrix in which each rows and columns may be bi-directionally scanned to provide high input capacity.

2. Background of Related Art

A keypad may be one of the most common user interfaces to electronic equipment, e.g., a computer, a TV, or a VCR, etc. Typically, a keypad, e.g., on a computer keyboard or on a TV remote controller, includes a plurality of keys arranged in a matrix of rows and columns. A computer user or a TV viewer may input their commands to and/or interact with the computer or the TV by pressing a particular key among a plurality of keys on a keypad.

Typically, the pressing of a key mechanically moves one or more corresponding electrical contact(s) to come into physical contact with another, thereby making an electrical connection between them. Depending on the type of connection mechanism employed, the electrical connection may be only momentary (e.g., may be disconnected when the key is released) or can be persistent (e.g., may remain connected even after releasing of the key until deliberately disconnected, e.g., by pressing the key again).

One example of connection mechanism that provides a momentary electrical connection is a push button, which provides electrical connection only while a button is being pressed, and disconnects when pressing is discontinued. On the other hand, a switch, once turned on, e.g., by pressing a key, remains on (i.e., connected) even if the key is released, until the switch is actively turned off, e.g., by pressing the key again, as is the case with a particular kind of switch called a toggle switch.

As with the keys, the corresponding connection mechanisms are also arranged in a matrix of rows and columns, typically referred to as a switch matrix. Thus, the position of each push button or switch within the matrix can be represented by a row and column coordinate, e.g., (row, col). For example, a push button located on the second row and at third column would have the coordinate (2, 3).

Typically, a switch matrix is "scanned" to determine which key is pressed. The scanning typically involves applying a known signal to a row, and examining each column. For example, if a signal level LOW was detected in column 2 while row 1 is being driven LOW, then the key at coordinate (1, 2) is determined as being pressed. This process is repeated for each of the rows, one row at a time, at a sufficiently rapid speed to detect even the briefest pressing of a key. With this scanning method, pressing of any key at any position within the matrix can be detected so long as only one key is pressed at a time.

As more and more advanced features are added to electronic equipment, the user interface thereto requires increasing number of keys. Unfortunately, the maximum number of keys a conventional switch matrix may scan and detect is limited to the product of the number of rows and the number of columns. For example, a conventional 4×4 switch matrix would support a maximum of 16 keys.

Thus, the size of conventional matrix must increase in order to accommodate increasing required number of keys, thus increasing the manufacturing cost of user interface devices.

Furthermore, a conventional scanning switch matrix can only accommodate momentary contact connection mechanisms, e.g., push buttons. Because a switch remains connected even after the release of the corresponding key, a sequential pressing of two keys would appear to a conventional scanning switch matrix as if the two keys were pressed simultaneously. Because a conventional scanning switch matrix can only detect one key press at a time, it cannot accommodate a switch.

Thus, if a user interface device requires both push buttons and switches, a dedicated detection mechanism must be provided for each switch in addition to the switch matrix. The additional detection mechanism adds complexity and cost to the user interface.

There is a need for a scanning switch matrix that is capable of accommodating more keys than the conventional maximum, i.e., the product of the number of rows and the number of columns.

There is also a need for more flexible and cost efficient switch matrix that allows integration of switches without the need for dedicated detection mechanism for the switches.

SUMMARY OF THE INVENTION

In accordance with the principles of the present invention, a switch matrix comprises at least one row conductor and at least one column conductor. At least one of the at least one row conductor and the at least one column conductor is capable of being driven with a predetermined voltage level, and is capable of having a voltage level read therefrom during a scanning of the switch matrix.

In accordance with an aspect of the principles of the present invention, a switch matrix comprises a plurality of row conductors, a plurality of column conductors; and a plurality of switching elements adapted to connect at least one of the plurality of row conductors to at least one of the plurality of column conductors, the total number of switching elements of the plurality of switching elements exceeds a product of a total number of row conductors of the plurality of row conductors and a total number of column conductors of the plurality of column conductors.

In accordance with another aspect of the principles of the present invention, a switch matrix comprises a plurality of row conductors, a plurality of column conductors, at least one switching element adapted to momentarily connect at least one of the plurality of row conductors to at least one of the plurality of column conductors; and at least one switching element adapted to persistently connect at least one of the plurality of row conductors to at least one of the plurality of column conductors.

In accordance with the principles of the present invention, a method of scanning a switch matrix comprises, driving one at a time at least one of a plurality of row conductors with a predetermined voltage level, monitoring each of a plurality of column conductors while one of the plurality of row conductors is being driven with the predetermined voltage level, driving one at a time at least one of a plurality of column conductors with a predetermined voltage level, and monitoring each of a plurality of row conductors while one of the plurality of column conductors is being driven with the predetermined voltage level.

In accordance with yet another aspect of the present invention, a switch matrix may be scanned without the need of fast switching signals being present in the row and column conductors, thus eliminating the need for a AC de-coupling, or a noise and/or EMI filtering capacitor.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a flexible and efficient switch matrix and scanning method thereof usable in user interface devices, e.g., a keypad or the like, having a number of connection mechanisms, e.g., push buttons and/or switches. A switch matrix device and scanning method thereof in accordance with the principles of the present invention is capable of accommodating a number of connection mechanisms up to twice the product of the number of rows and the number of columns.

A switch matrix device and scanning method thereof allows integration of one or more switches in the switch matrix without the need for additional detection mechanisms dedicated to the switches.

While, for the sake of brevity and clarity, an exemplary matrix having three (3) rows and three (3) columns, i.e., 3×3 switch matrix is described, the present invention is equally applicable to matrixes of any size, i.e., having any number of rows or any number of columns, and equally applicable to symmetrical matrixes, i.e., having equal number of rows and columns, as well as unsymmetrical matrixes.

Figure 6:
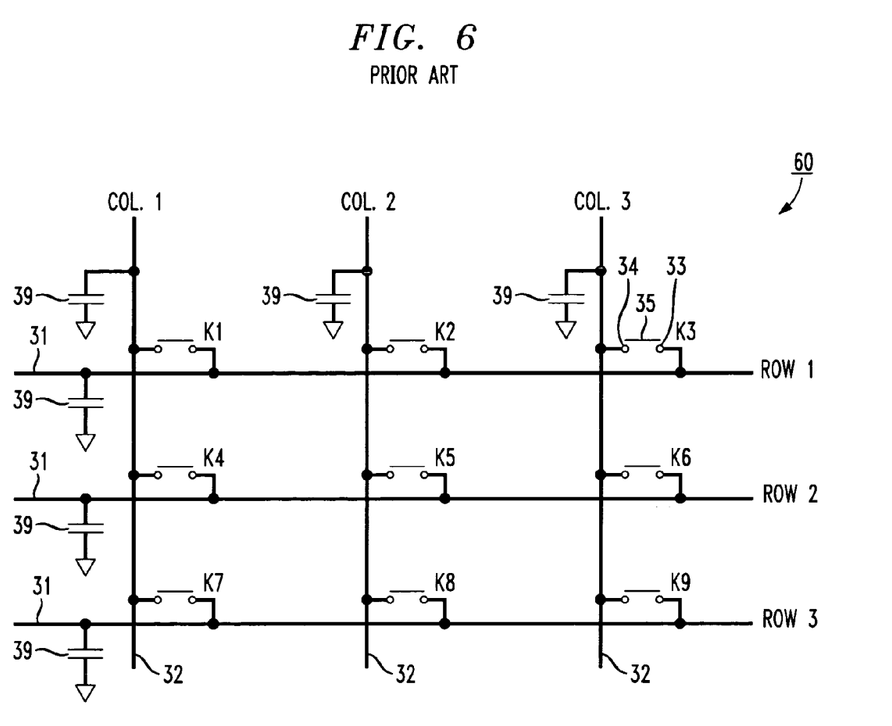
FIG. 6 is a simplified schematic of an exemplary conventional 3×3 switch matrix.

FIG. 6 shows a simple exemplary conventional switch matrix with nine (9) connection mechanisms arranged as a matrix of three (3) rows and three (3) columns.

In particular, FIG. 6 shows nine (9) push buttons, K1–K9. Each of the nine push buttons K1–K9 has a pair of electrical contacts 33 and 34, and a connection button 35. Each electrical contact 33 is connected to a row conductor 31 while each electrical contact 34 is connected to the column conductor 32. The push buttons on the same column or on the same row share the same column conductor 32 or the same row conductor 31, respectively. For example, push buttons K1, K2 and K3 share the same row conductor 31 of Row 1 while push buttons K1, K4 and K7 share the same column conductor 32 of Col. 1.

In order to detect a push button being pressed, an algorithm is provided to scan each of the push buttons. During the scanning, a unique signal is applied to one row at a time and each of the columns is monitored for the presence of the unique signal. This process is repeated for each row, one at a time, on a rapid basis to ensure that even the briefest closure of a connection mechanism will be detected.

When the unique signal is applied to a particular row, the other rows are connected to a different voltage by high impedance to prevent excessive currents in the event that more than one switch in a column is depressed. In a typical conventional circuit, the rows may be driven low and the columns are passively pulled high to a voltage level, e.g., to VCC or VDD, above the switching threshold of a monitoring circuitry, e.g., an input receiver of a controller (not shown).

When contacts 34 and 35 are disconnected (i.e., when the button 35 is not pressed), the column conductor 32 remains unconnected from the row conductor 31. Thus, the voltage at the input of the receiver 36 remains high (e.g., at VDD), or at high impedance (e.g., tri-stated, Hi-Z). However, when the button 35 is pressed to bring the contacts 33 and 34 into an electrical connection, the conductors 31 and 32 are connected to each other. If conductor 31 is driven low, the voltage at the input receiver of the controller would be driven low. Thus, pressing of any push buttons K1–K9 can be detected by driving each row LOW, and monitoring for a LOW voltage at each column, For example, assume that the push button K5 (and no other push button at the same time) is pressed. The scanning algorithm would first drive Row 1 Low (and drive Rows 2 and 3 HIGH or high impedance (i.e., tri-stated output), and check the voltage levels of each of columns Col. 1–Col. 3, one column at a time. Because the push buttons K1–K3 were not pressed, a high voltage level, e.g., VDD, or a high impedance voltage level would be detected at each of columns Col. 1–Col. 3.

The algorithm would then drive Row 2 LOW (and drive Rows 1 and 3 HIGH), and check the voltage levels of each of columns Col. 1–Co. 3, one column at a time. Because the push buttons K4 and K6 were not pressed, a high voltage level, e.g., VDD, would be detected at each of columns Col. 1–Col. 3. However, because Row 2 would be driven LOW, a LOW voltage would be detected at Col. 2 through the connection made between conductor 31 and conductor 32 via the connections between contacts 33 and 34 due to pressing of the button 35 at the push button K5.

When Row 3 is driven LOW by the algorithm, and Col. 1–Col. 3 are monitored, a HIGH voltage level or High Impedance level would be detected at each of the columns. Thus, a determination can be made that the push button K5 was pressed by the fact that LOW voltage was detected only at the coordinate (2, 2), corresponding to the position of the push button K5.

Because of the sequential switching (e.g., from LOW to HIGH) at each of the coordinates, a very High frequency AC signal may be carried by each of the conductors 31 and 32. The AC signals typically results in noise signals which must be minimized by the use of a low impedance AC shunt to ground for each row conductor 31 and column conductors 32 through an EMI capacitor 39. Thus, in a conventional switch matrix, the use of the AC de-coupling (or EMI and/or noise filter) capacitor 39 is required for a proper operation.

Furthermore, it can be appreciated that the above-described conventional switch matrix requires that each crossing of a row and column conductors 31 and 32 has a single unique coordinate (Row, Column). That is any pair of a row conductor and a column conductor may be assigned one unique coordinate. Thus, for example, a pair of second row and third column would have a coordinate (2, 3). Thus, a conventional switch matrix can accommodate a maximum of rows×columns (e.g., 9 in the above 3×3 matrix example) of switching elements, e.g., buttons or keys, each button or key being uniquely addressable by the coordinate (Row, Column).

Figure 1:
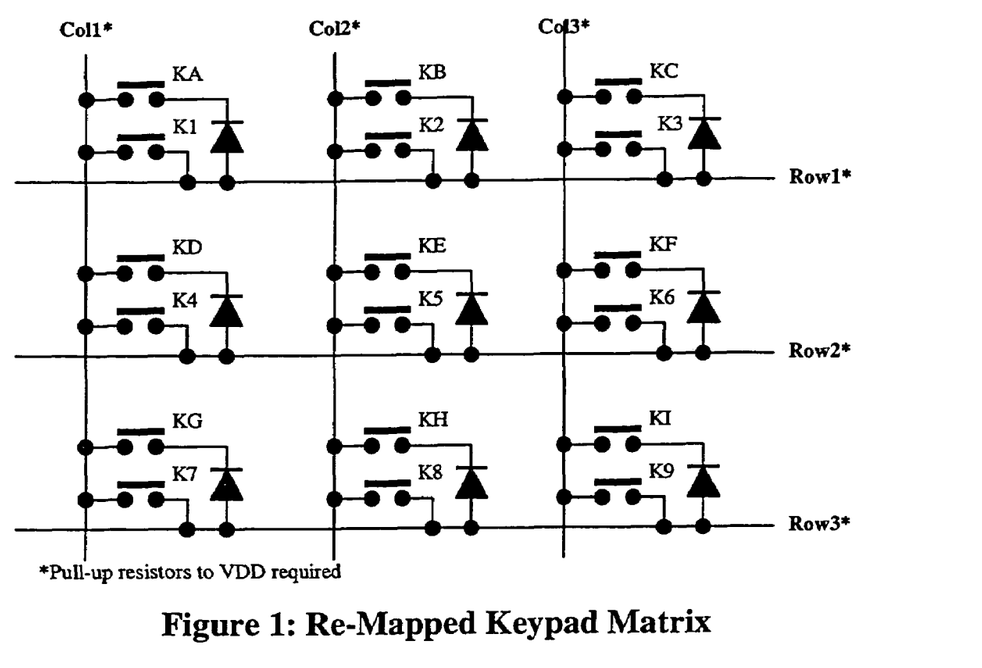
FIG. 1 is a simplified schematic of an exemplary 3×3 switch matrix, in accordance with the principles of the present invention.

In contrast, the switch matrix 10 in accordance with the principles of the present invention shown in FIG. 1 may accommodate up to twice the size of the matrix, i.e., 2×rows×columns, of push buttons, doubling the capacity of a conventional switch matrix. As will be explained, each crossing (or pair) of a row and a column can have two unique coordinates, e.g. (Row, Column) and (Column, Row), thus can support up to two push buttons, each being uniquely addressable.

In particular, the switch matrix shown in FIG. 1 has two push buttons and a blocking diode 12 at each coordinate. Thus, the 3×3 switch matrix of FIG. 1 has 18 push buttons KA–KI and K1–K9, i.e., twice the product of the numbers of rows and columns.

Although the blocking diode 12 is shown in this example as being connected between switching elements KA–KI and the respective row conductor 31, it should be readily apparent to one of ordinary skill that the diode may be placed in other places, e.g., between the switching elements KA–KI and the respective column conductors 32, or between switching elements K1–K9 and either the row conductors 31 or the column conductors 32 so long as it becomes forward biased when a respective row is driven LOW or when a respective column is driven LOW, but not when the respective row and column are both driven LOW.

Unlike a conventional switch matrix, the switch matrix in accordance with the principles of the present invention allows monitoring voltage levels of both the row conductors 31 and the column conductors 32. Moreover, unlike a conventional switch matrix, the switch matrix of FIG. 1 allows driving both the row conductors 31 and the column conductors 32. That is, both the row conductors 31 and column conductors 32 of the switch matrix in accordance with the principles of the present invention are bi-directional, and can be either an input or an output, at any given time.

The blocking diode 12 is reverse biased when the respective row conductor is driven LOW, and the corresponding switching element, e.g., the corresponding push button KA–KI is connected. Thus, even if the respective switching element KA–KI is connected, the corresponding row conductor 31 and the column conductors 32 remain disconnected to each other.

However, when a respective column is driven LOW, and the corresponding switching element KA–KI is connected, the diode 12 is forward biased, and thus the corresponding row conductor 31 and the column conductor 32 are connected. When columns are being driven, the voltage driven on the column conductor 32 (less the forward bias voltage drop over the diode which is typically on the order of half a volt) will be placed on the row conductor 31 if the corresponding switching element KA–KI is connected. Thus, by monitoring the voltage level of the respective row conductor, a closure of a switch element KA–KI may be detected.

Thus, it can be appreciated that closure of a switching element K1–K9 can be detected by driving each row, one at a time, and monitoring each of the columns. Because the diode 12 is reverse biased when a row conductor 31 is driven LOW, any closure of switching elements KA–K9 would not have any effect on the monitored voltages of any of the column conductors 32. During this forward scanning (label- ing only as a convenience, scanning where only the rows are driven will be referred hereafter as a forward scan, and scanning where only the columns are being driven will be referred as a reverse scan), closure of any of switching elements K1–K9 can be detected.

During a reverse scan, when a column conductor is driven LOW, the corresponding diode 12 will be forward biased when the corresponding switching element KA–KI is connected, and thus any closure of switching elements KA–KI can be made as described previously.

Thus, during a forward scan, coordinates can be expressed as (Row, Column) as was the case with a conventional switch matrix. However, during a reverse scanning, a coordinate (Column, Row) may be provided. Unlike a conventional switch matrix, in a switch matrix in accordance with the principles of the present invention, a coordinate (Row, Column) is unique from a coordinate (Column, Row).

For example, in a conventional switch matrix, a coordinate (Row=2, Column=3) and a coordinate (Column=3, Row=2) describe the same switching element, namely K6, i.e., the one present at the crossing of the second row conductor and the third column conductor. In a switch matrix in accordance with the principles of the present invention, a coordinate (Row=2, Column=3) and a coordinate (Column=3, Row=2) describe two different switching elements, namely K6 and KF, respectively.

By alternating a forward scan and a reverse scan in one scanning cycle as shown in FIG. 1A, all eighteen switching elements can be monitored for their closure.

Figure 2:
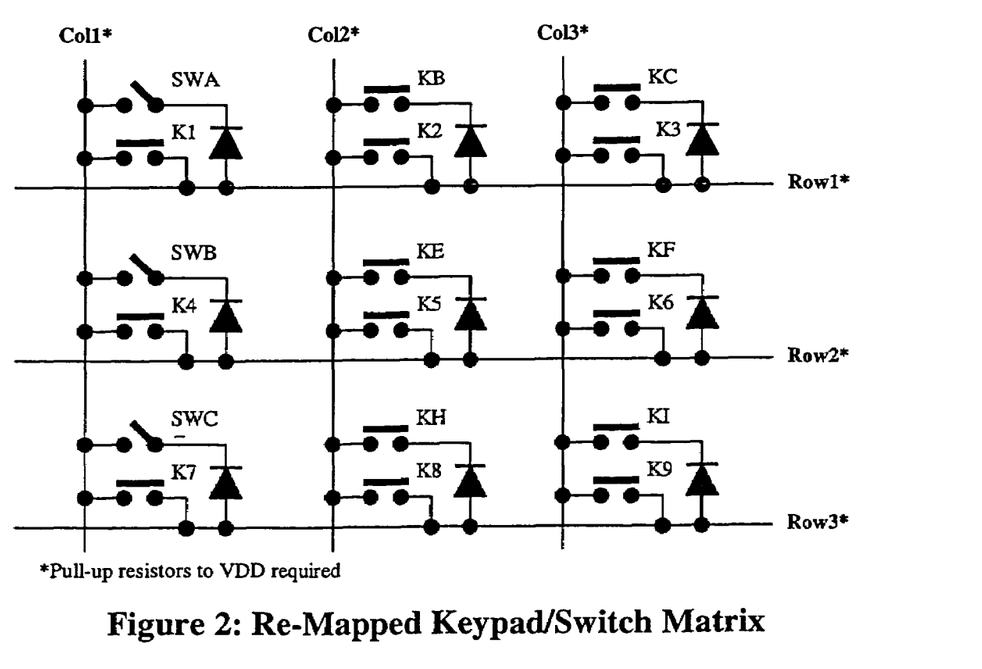
FIG. 2 is a simplified schematic of an exemplary 3×3 switch matrix having integrated switches, in accordance with the principles of the present invention.

FIG. 2 shows another exemplary switch matrix having integrated persistent connection switches, in accordance with the principles of the present invention.

In particular, FIG. 2 shows a switch matrix 20 identical to switching matrix as FIG. 2 in every respect but having persistent connection switches SWA–SWC in three coordinates of the column 1 in stead of the push buttons KA, KD and KG.

The switch matrix 20 operates essentially as the switching matrix 10 of FIG. 1 despite the inclusion of the switches SWA–SWC.

For example, during a forward scan, the switches SWA–SWC would not have any affect on the switching matrix because as with switching matrix 10, the diodes 12 would be reverse biased, and the switches would be isolated from the row and column conductors.

During a reverse scan, because only one column driver 37' is enabled at a time, and only one row receiver is read at a time, each of the switches SWA–SWC can be uniquely monitored to detect their closure.

For example, when column 1 is driven LOW, and the receiver of row 1 is read LOW, then the switch SWA must be closed, regardless of the status of other switches SWB and SWC. Thus, closure of any switches SWA–SWC can be uniquely detected.

It can thus be appreciated that persistent connection type switching elements can be integrated into the same switching matrix alongside temporary connection type switching elements scanned with the same scanning algorithm, without requiring a dedicated scanning or detection mechanism for either the persistent connection or the temporary connection type switching elements.

Figure 3:
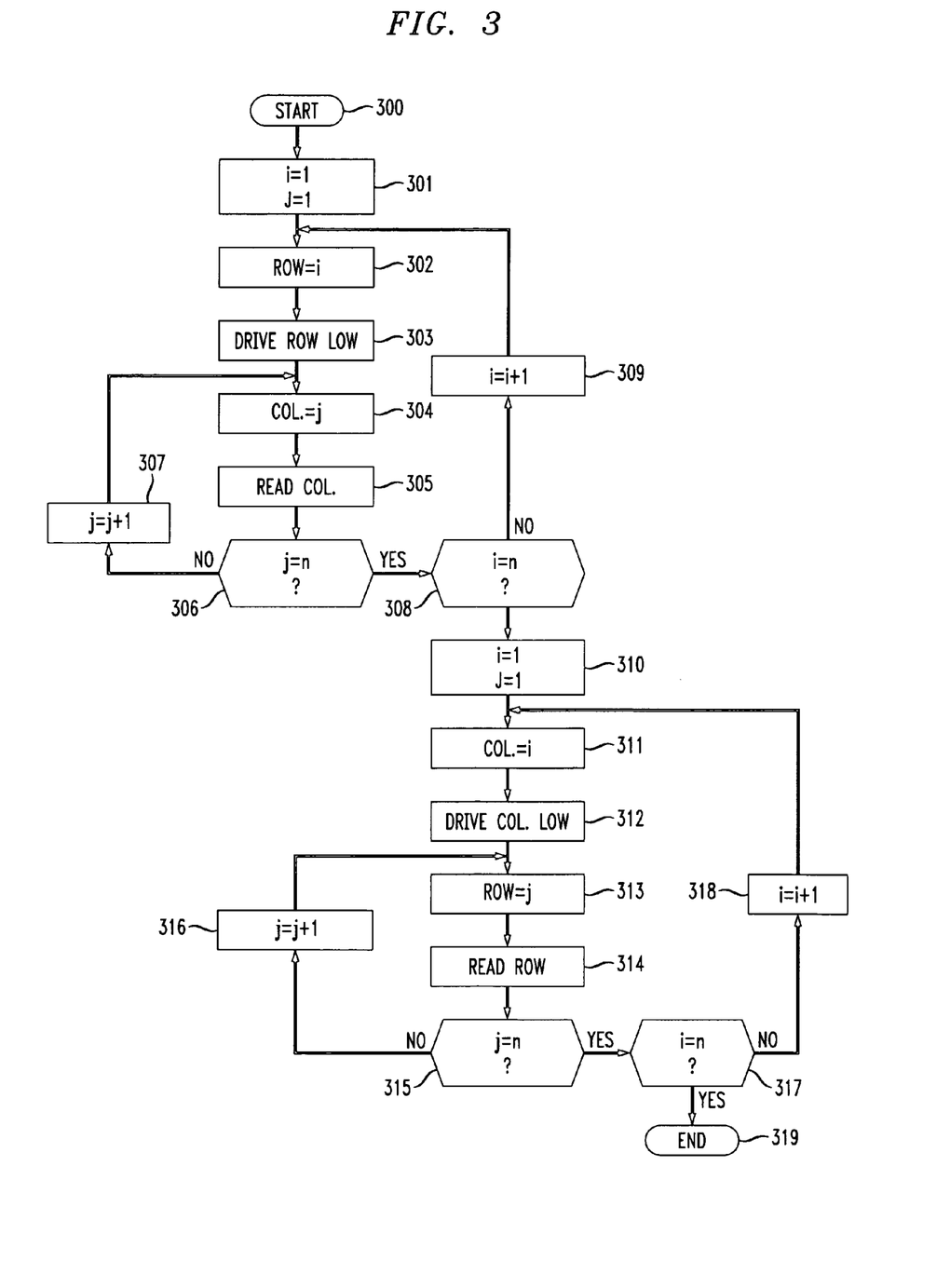
FIG. 3 is a flow chart showing the scanning of the exemplary 3×3 switch matrices shown in FIGS. 1 and 2, in accordance with the principles of the present invention.

FIG. 3 shows a flow chart of scanning algorithm usable with the exemplary embodiments of the switch matrices according to the principles of the present invention as shown in FIGS. 1 and 2.

In particular, during forward scanning steps 301–309, each of the row conductors 31 is driven LOW (i.e., walking a zero), and the column conductors 32 are monitored one at a time to detect the closure, if any, of switch elements K1–K9 as previously described. More particularly, in step 301, the first row and the first column, for example, are chosen as the starting point of the forward scan. It should be apparent to and understood by one having an ordinary skill that the starting point need not be the coordinate (1,1), and may be any other coordinate. As shown in steps 304–307, each of the columns 1 to n (e.g., 1 to 3 in 3×3 switch matrices as shown in the examples of FIGS. 1 and 2) are monitored (in step 305) while each row i is driven LOW (step 303). In step 306, a determination is made whether or not all columns have been monitored (or read) by comparing the current column j with the maximum number of columns n, e.g., 3 in the examples of FIGS. 1 and 2). In step 308, a determination is made whether or not all rows had been driven LOW by comparing the current row i with the maximum number of rows n, e.g., 3 in the examples of FIGS. 1 and 2).

During a reverse scanning steps 310–318, each of the column conductors 32 is driven LOW (i.e., walking a zero), and the row conductors 31 are monitored one at a time to detect the closure, if any, of switch elements KA–KI as previously described. More particularly, in step 310, the first row and the first column, for example, are chosen as the starting point of the reverse scan. It should be apparent to and understood by one having an ordinary skill that the starting point need not be the coordinate (1,1), and may be any other coordinate. As shown in steps 312–316, each of the rows 1 to n (e.g., 1 to 3 in 3×3 switch matrices as shown in the examples of FIGS. 1 and 2) are monitored (in step 305) while each column i is driven LOW (step 312). In step 315, a determination is made whether or not all rows have been monitored (or read) by comparing the current row j with the maximum number of columns n, e.g., 3 in the examples of FIGS. 1 and 2). In step 308, a determination is made whether or not all columns had been driven LOW by comparing the current column i with the maximum number of columns n, e.g., 3 in the examples of FIGS. 1 and 2).

As can be appreciated, the bi-directional scanning switch matrix according to the principles of the present invention may be readily realized by a modification to the scanning algorithm as shown in FIG. 3. A further modification of the scanning algorithm for the embodiment shown in FIG. 2 can be minimized by ensuring that any individual column contains switching elements of the same type, i.e., either push buttons or switches.

Figure 4:
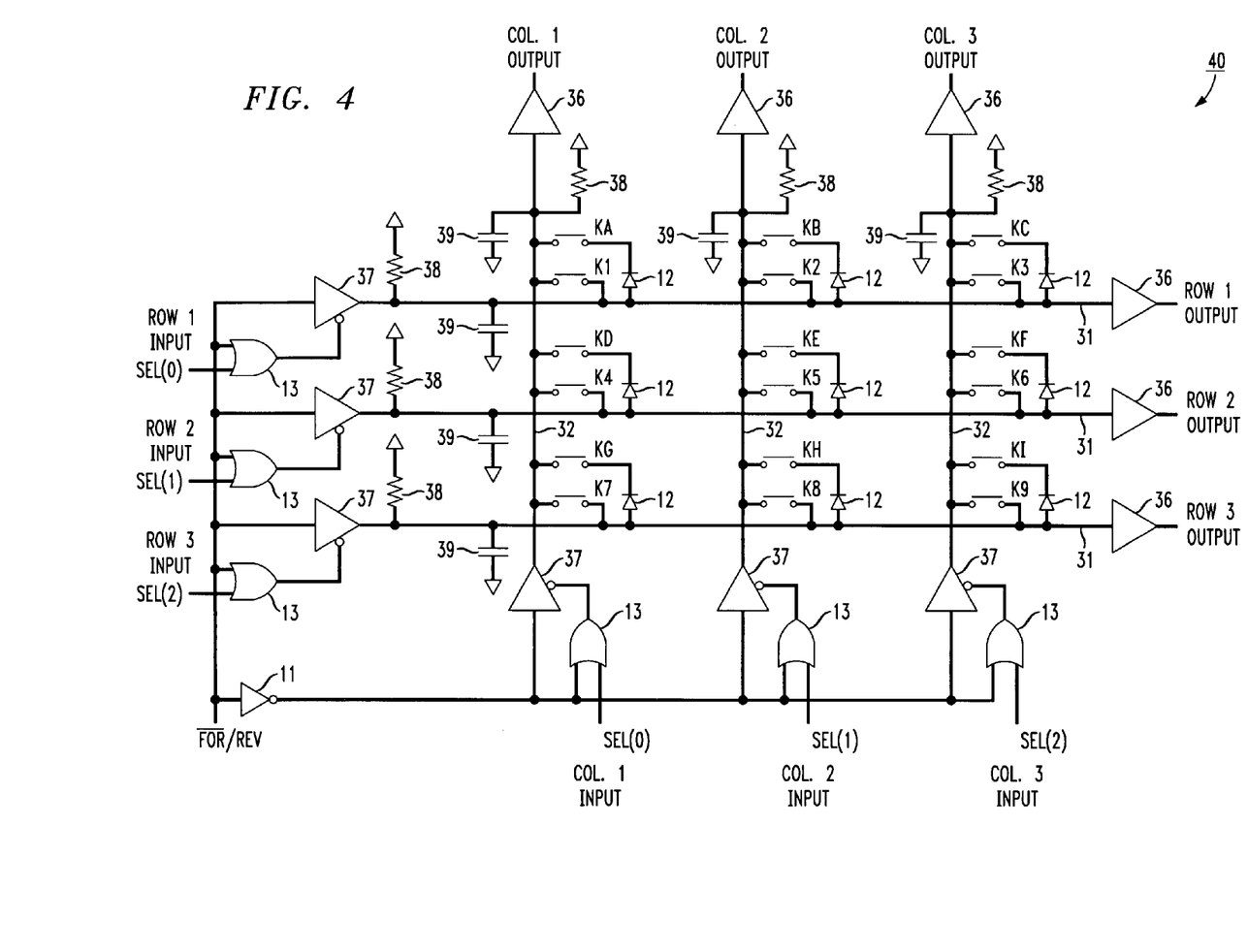
FIG. 4 is a simplified schematic of an exemplary hardware implementation of the scanning of the 3×3 switch matrix, in accordance with the principles of the present invention.

FIG. 4 shows another embodiment of the switch matrix according to the principles of the present invention, with a hardware implemented scanning algorithm.

In particular, FIG. 4 shows a switch matrix 40 having three rows and three columns, i.e., a 3×3 matrix.

Each row conductor 31 is connected to an output of a driver 37. A driver 37 may be, e.g., a line driver or an open collector amplifier, etc. Each column conductor 32 is connected to an input of a receiver 36. A receiver 36 may be, e.g., a line receiver or a detector amplifier. The receiver 36 may be Schmidt triggered to account for the direction of transition (i.e., high to low or low to high) of signal at the input of the receiver 36.

Each row conductor 31 and each column conductor 32 are pulled high to a voltage level above the switching threshold of the receiver 36, through a pull-up resistor 38. Typically, the row and column conductors are pulled up to voltage level equal to the supply voltage of the electronics in the device, usually denoted as VCC or VDD.

The pull up resistors 38 must be large compared to the intrinsic resistance in the conductors 31 and 32, and the expected contact resistance of the button 35 and the contacts 33 and 34 in order for proper detection threshold to be reached when keys are depressed. The pull up resistors 38 must also be large in case many keys in the matrix are depressed at once, which effectively places the pull up resistors 38 in parallel.

Figure 5:
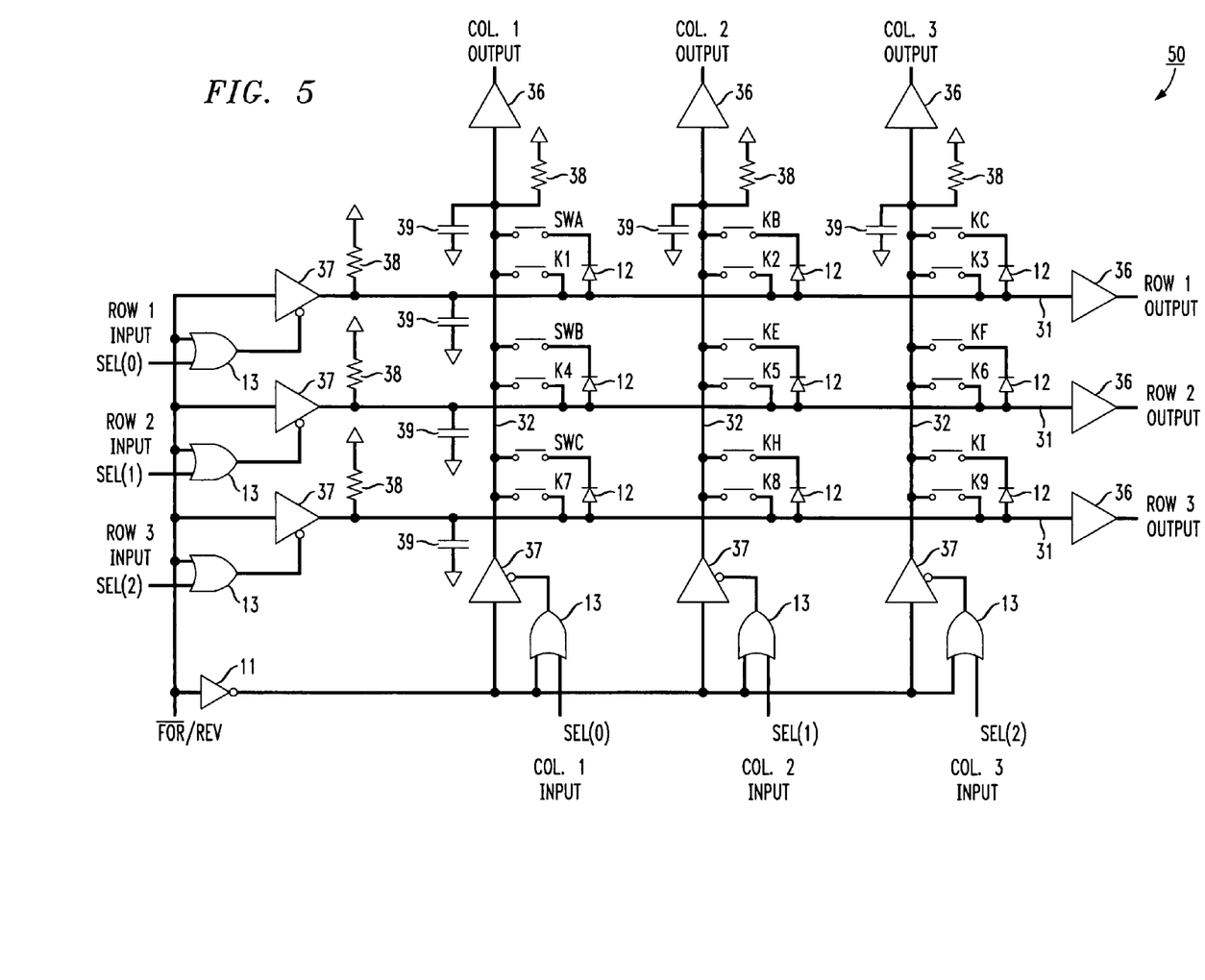
FIG. 5 is a simplified schematic of an exemplary hardware implementation of the scanning of the 3×3 switch matrix having integrated switches, in accordance with the principles of the present invention.

In contrast to a conventional switch matrix, the switch matrix of the present invention may be scanned by applying a level voltage, e.g., level LOW voltage and level High Impedance voltage, no AC noise signal may be present in the conductors 31 and 32. Thus, although the embodiments of FIGS. 4 and 5 show optional EMI capacitors 39 for protection against electrostatic discharge (ESD) damages, the capacitors 39 are not necessary for proper operation of the switch matrices shown in FIGS. 4 and 5. Thus, the present invention provides switch matrices that can be properly scanned without the need for AC coupling capacitors.

The row conductors 31 and the column conductors 32 are arranged and operate similarly as those of the conventional switch matrix shown in FIG. 6 as previously described.

In addition, the switch matrix shown in FIG. 4 has two push buttons and a blocking diode 12 at each coordinate. Thus, the 3×3 switch matrix of FIG. 1 has 18 push buttons KA–KI and K1–K9, i.e., twice the product of the numbers of rows and columns.

Although the blocking diode 12 is shown in this example as being connected between switching elements KA–KI and the respective row conductor 31, it should be readily apparent to one of ordinary skill that the diode may be placed in other places, e.g., between the switching elements KA–KI and the respective column conductors 32, or between switching elements K1–K9 and either the row conductors 31 or the column conductors 32 so long as it becomes forward bias when a respective row is driven LOW or when a respective column is driven LOW, but not both times.

FIG. 4 further shows receivers 36 on both the row conductors 31 and the column conductors 32 to allow monitoring voltage levels of both the row conductors 31 and the column conductors 32.

Furthermore, the switch matrix of FIG. 4 includes outputs of the drivers 37 being connected to both the row conductors 31 and the column conductors 32 to allow driving both the row conductors 31 and the column conductors 32.

Thus, both the row conductors 31 and column conductors 32 of the switch matrix in accordance with the principles of the present invention are bi-directional, and can be either an input or an output, at any given time.

The drivers 37 each has a tri-state output, and includes an enable input (shown as a bubble) by which the driver 37 may be enabled to output a predetermined voltage level, or may be disabled to output a high impedance signal, which may be considered as disconnecting the output from the row or column conductors. That is when a driver 37 is disabled, it appears disconnected (or open) to the respective row or column conductor.

Each of the selection signals SEL (0), SEL (1) and SEL (2) are produced, for example, under the control of a scanning algorithm for scanning the switching matrix of FIG. 1 for a presence of a closure of a switching element KA–KI and K1–K9, and select which driver 37 is to be enabled.

The forward or reverse signal $\overline{\text{FOR/REV}}$ together with the selection signals is used to select which driver 37 is to be enabled, and also supplies LOW signal to the input of drivers 37. The OR-Gates 13 ensure that the row drivers 37 are enabled only when both $\overline{\text{FOR/REV}}$ signal and the respective selection signal are low, and that the column drivers 37 are enabled only when the inverse of $\overline{\text{FOR/REV}}$ signal and the respective selection signal are both low. The inverter 11 inverts the $\overline{\text{FOR/REV}}$ signal to ensure that the rows or the columns are not both enabled at the same time. The truth table for the $\overline{\text{FOR/REV}}$ signal and the selection signals with respect to the selection of a driver to be enabled is shown in Table 1 below.

TABLE 1

| $\overline{\text{FOR/REV}}$ | SEL (0) | SEL (1) | SEL (2) | Driver 37' output of |
|---|---|---|---|---|
| 0 | 0 | 1 | 1 | Row 1 LOW, all other Hi-Z |
| 0 | 1 | 0 | 1 | Row 2 LOW, all other Hi-Z |
| 0 | 1 | 1 | 0 | Row 3 LOW, all other Hi-Z |
| 1 | 0 | 1 | 1 | Col. 1 LOW, all other Hi-Z |
| 1 | 1 | 0 | 1 | Col. 2 LOW, all other Hi-Z |
| 1 | 1 | 1 | 0 | Col. 3 LOW, all other Hi-Z |

The scanning algorithm cycles through the above sequence of signals of $\overline{\text{FOR/REV}}$, SEL (0), SEL (1) and SEL (2) as shown in table 1 above.

The blocking diode 12 is reverse biased when the respective row conductor is driven LOW, and the corresponding switching element, e.g., the corresponding push button KA–KI is connected. Thus, even if the respective switching element KA–KI is connected, the corresponding row conductor 31 and the column conductors 32 remain disconnected to each other.

However, when a respective column is driven LOW, and the corresponding switching element KA–KI is connected, the diode 12 is forward biased, and thus the corresponding row conductor 31 and the column conductor 32 are connected. When columns are being driven, the voltage driven on the column conductor 32 (less the forward bias voltage drop over the diode which is typically on the order of half a volt) will be placed on the row conductor 31 if the corresponding switching element KA–KI is connected. Thus, by monitoring the voltage level of the respective row conductor, a closure of a switch element KA–KI may be detected.

Thus, it can be appreciated that closure of a switching element K1–K9 can be detected by driving each row, one at a time, and monitoring each of the columns. Because the diode 12 is reverse biased when a row conductor 31 is driven LOW, any closure of switching elements KA–K9 would not have any effect on the monitored voltages of any of the column conductors 32. Thus, during this forward scanning (labeling only as a convenience, scanning where only the rows are driven will be referred hereafter as a forward scan, and scanning where only the columns are being drive will be referred as a reverse scan), closure of any of switching elements K1–K9 can be detected.

During a reverse scan, when a column conductor is driven LOW, the corresponding diode 12 will be forward biased when the corresponding switching element KA–KI is connected, and thus any closure of switching elements KA–KI can be made as described previously.

Thus, during a forward scan, coordinates can be expressed as (Row, Column) as was the case with a conventional switch matrix. However, during a reverse scanning, a coordinate (Column, Row) may be provided. Unlike a conventional switch matrix, in a switch matrix in accordance with the principles of the present invention, a coordinate (Row, Column) is unique from a coordinate (Column, Row).

For example, in a conventional switch matrix, a coordinate (Row=2, Column=3) and a coordinate (Column=3, Row=2) describe the same switching element, namely K6, i.e., the one present at the crossing of the second row conductor and the third column conductor. In a switch matrix in accordance with the principles of the present invention, a coordinate (Row=2, Column=3) and a coordinate (Column=3, Row=2) describe two different switching elements, namely K6 and KF, respectively.

Figure 4A:
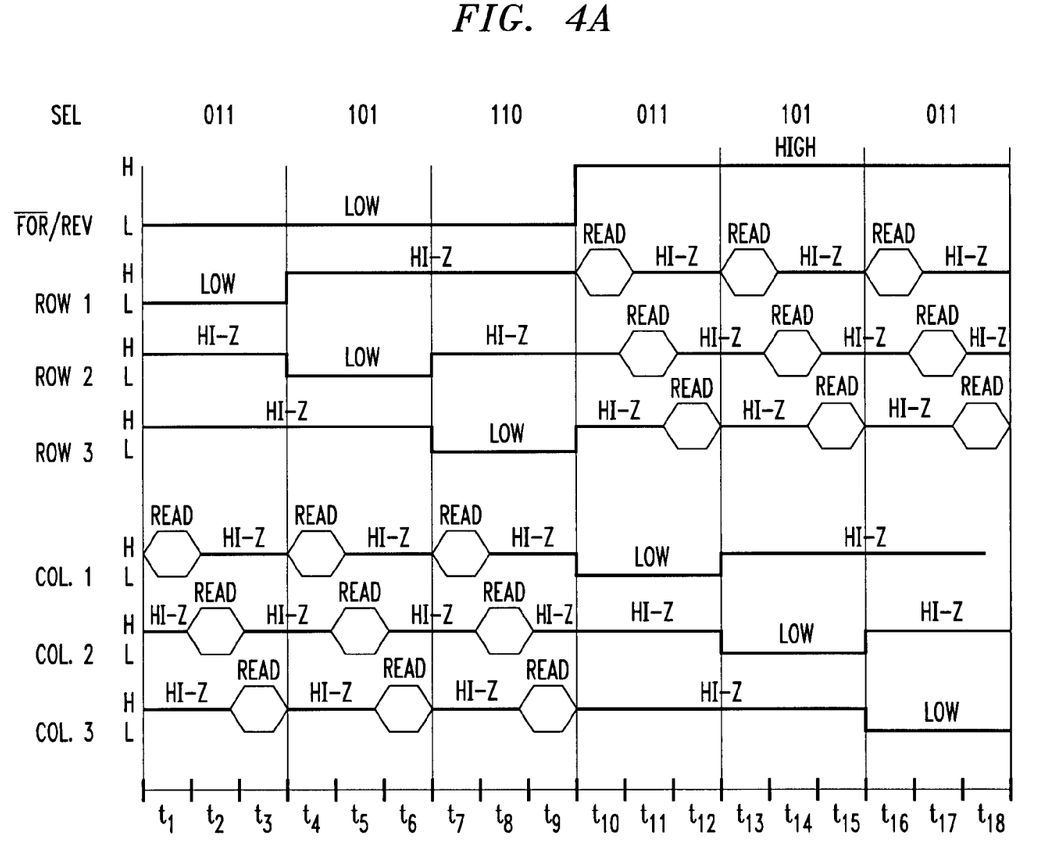
FIG. 4A is a timing diagram of scanning cycle of an exemplary 3×3 switch matrix shown in FIG. 4, in accordance with the principles of the present invention.

By alternating a forward scan and a reverse scan in one scanning cycle as shown in FIG. 4A, all eighteen switching elements can be monitored for their closure.

As shown in FIG. 4A, a complete scanning cycle may include time periods t1–t18, each of which correspond to a reading of a particular row or column conductor 31 and 32 by a corresponding receiver 36 while a particular row or column conductor 31 and 32 is being driven LOW.

For example, during the time periods t1–t9, $\overline{\text{FOR/REV}}$ is low, and the signal from the inverter 11 is HIGH, thus all column drivers 37 are disabled, and appear to column conductors 32 as if they are entirely absent. Thus, during the time periods t1–t9, a forward scan is performed, i.e., rows are driven and columns are monitored.

During the time periods t1–t3, row 1 (by keeping the selection signals at 011 to enable only the driver 37 of row 1) is driven LOW, and each column is read by the respective receiver 36, e.g., column 1 is read during time period t1, column 2 is read during time period t2, etc. In this manner status of all nine switching elements K1–K9 are checked during the forward scan period, i.e., t1–t9.

Immediately following the forward scan, i.e., during time periods t10–t18, the scanning algorithm would produce a HIGH $\overline{\text{FOR/REV}}$ signal, which disables all row drivers 37 to output high impedance signal. The column drivers 37 are driven LOW, one at a time, and each of the row receivers 36 is read as shown. Because the LOW signal at the cathodes of the diodes 12, the diode 12 is forward biased if the corresponding switching element, i.e., the corresponding one of the push buttons KA–KI, is closed. Thus, when one of the switching elements KA–KI is closed, the corresponding row receiver 36 will read the LOW voltage (with the forward voltage drop of the diode added) when the corresponding column is driven LOW.

Thus, switching elements KA–KI are monitored during the reverse scanning period, t10–t18, and all switching elements K1–K9 and KA–KI are monitored during a complete scan cycle t1–t18.

FIG. 5 shows another exemplary hardware embodiment of the switch matrix having integrated persistent connection switches, in accordance with the principles of the present invention.

In particular, FIG. 5 shows a switch matrix 50 identical to switching matrix as FIG. 4 in every respect but having persistent connection switches SWA–SWC in three coordinates of the column 1 in stead of the push buttons KA, KD and KG.

The switch matrix 50 operates essentially as the switching matrix 40 of FIG. 4 despite the inclusion of the switches SWA–SWC.

For example, during a forward scan, the switches SWA–SWC would not have any affect on the switching matrix because as with switching matrix 50, the diodes 12 would be reverse biased, and the switches would be isolated from the row and column conductors.

During a reverse scan, because only one column driver 37 is enabled at a time, and only one row receiver is read at a time, each of the switches SWA–SWC can be uniquely monitored to detect their closure.

For example, when column 1 is driven LOW, and the receiver of row 1 is read LOW, then the switch SWA must be closed, regardless of the status of other switches SWB and SWC. Thus, closure of any switches SWA–SWC can be uniquely detected.

It can thus be appreciated that persistent connection type switching elements can be integrated into the same switching matrix alongside temporary connection type switching elements scanned with the same scanning algorithm, without requiring a dedicated scanning or detection mechanism for either the persistent connection or the temporary connection type switching elements.

While the switching matrix and method according to the principles of the present invention have been described particularly with reference to a preferred embodiment using an exemplary circuit implementation, the present invention may be implemented with any such variation of the circuits capable of allowing bi-directional scanning of the switch matrix while ensuring alternatively driving and reading columns and rows, i.e., ensuring that both rows and columns are not driven at the same time.

Furthermore, while the switch matrix in accordance with the principles of the present invention is described using an exemplary embodiment showing three integrated persistent connection switching elements, the present invention may be implemented with any number of such persistent connection switching elements, in any position within the switch matrix, either in the forward scan group or reverse scan group, or monitoring memory access by a processor, and capable of overlaying system and/or user definable information in a faster memory.

While the invention has been described with reference to the exemplary embodiments thereof, those skilled in the art will be able to make various modifications to the described embodiments of the invention without departing from the true spirit and scope of the invention.

What is claimed is:

1. A switch matrix, comprising:
at least one row conductor;
at least one column conductor, wherein each of said at least one row conductor and said at least one column conductor are capable of being driven with a predetermined voltage level, and being capable of being read therefrom a voltage level; and
a plurality of switching elements adapted to connect said at least one row conductor to said at least one column conductor, said plurality exceeding a number obtained by multiplying together a number of said at least one row conductor and a number of said at least one column conductor;
a first current path to connect all row conductors and all column conductors, said first current path implemented to allow current to flow bi-directionally therethrough; and
a second current path to connect all row conductors and all column conductors, said second current path comprising a diode to allow current to flow only in one direction therethrough.

2. The switch matrix according to claim 1, wherein:
at least one of said plurality of switching elements is a temporary connection type switching element.

3. The switch matrix according to claim 1, wherein:
at least one of said plurality of switching elements is a momentary switch.

4. The switch matrix according to claim 1, wherein:
at least one of said plurality of switching elements is a persistent connection type switching element.

5. The switch matrix according to claim 1, wherein:
said plurality is twice a number obtained by multiplying together said number of said at least one row conductor and said number of said at least one column conductor.

6. The switch matrix according to claim 1, wherein:
said one direction allows current to flow from one of said at least one row, to one of said at least one column.

7. The switch matrix according to claim 1, wherein:
only one diode voltage drop is switchably connected between each said at least one row conductor and each said at least one column conductor.

8. A switch matrix, comprising:
a plurality of row conductors;
a plurality of column conductors, each of said plurality of row conductors and each of said plurality of column conductors are capable of being driven with a predetermined voltage level, and being capable of being read therefrom a voltage level;
a plurality of switching elements including at least one momentary push button adapted to connect at least one of said plurality of row conductors to at least one of said plurality of column conductors;
a first current path to connect all row conductors and all column conductors, said first current path implemented to allow current to flow bi-directionally therethrough; and
a second current path to connect all said row conductors and all said column conductors, said second current path comprising a diode to allow current to flow only in one direction therethrough;
wherein a total number of switching elements of said plurality of switching elements exceeds a product of a total number of row conductors of said plurality of row conductors and a total number of column conductors of said plurality of column conductors; and
wherein some of said plurality of switching elements are implemented to allow current to flow bi-directionally therethrough, and others of said plurality of switching elements are restricted to allow current to flow only in one direction therethrough.

9. The switch matrix according to claim 8, wherein:
said total number of switching elements is twice said product of said total number of row conductors and said total number of column conductors.

10. The switch matrix according to claim 8, wherein:
said one direction allows current to flow from one of said at least one row, to one of said at least one column.

11. The switch matrix according to claim 8, wherein:
only one diode voltage drop is switchably connected between each said at least one row conductor and each said at least one column conductor.

12. A switch matrix, comprising:
a plurality of row conductors;
a plurality of column conductors;
a plurality of momentary switching elements adapted to momentarily connect at least one of said plurality of row conductors to at least one of said plurality of column conductors;
a plurality of persistent switching elements adapted to persistently connect at least one of said plurality of row conductors to at least one of said plurality of column conductors;
a first current path to connect all said row conductors and all said column conductors, said first current path implemented to allow current to flow bi-directionally therethrough and;

a second current path to connect all row conductors and all column conductors, said second current path comprising a diode to allow current to flow only in one direction therethrough;

wherein a total of said plurality of momentary switching elements and said plurality of persistent switching elements exceed a number obtained by multiplying together a number of said plurality of row conductors and a number of said plurality of column conductors; and wherein some of said plurality of momentary switching elements are implemented to allow current to flow bi-directionally therethrough, and others of said plurality of momentary switching elements are restricted to allow current to flow only in one direction therethrough.

13. The switch matrix according to claim 12, wherein:

said at least one momentary switching element includes at least one push.

14. A method of scanning a switch matrix, comprising:

permitting at least one of a plurality of switches in a first current path connecting all row conductors and all column conductors to allow current to flow bi-directionally therethrough; and permitting at least one of said plurality of switches in a second current path connecting all said row conductors and all said column conductors to allow current to flow only in one direction through a diode therethrough;

persistently connecting at least one of a plurality of row conductors to at least one of a plurality of column conductors;

driving one at a time each of said plurality of row conductors with a predetermined row voltage level;

monitoring each of said plurality of column conductors for a given voltage drop corresponding to a closed one of said plurality of switches to a driven one of said plurality of row conductors, while one of said plurality of row conductors is being driven with said predetermined row voltage level;

driving one at a time each of said plurality of column conductors with a predetermined column voltage level; and monitoring each of said plurality of row conductors for a given voltage drop corresponding to a closed one of said plurality of switches to a driven one of said column conductors, while one of said plurality of column conductors is being driven with said predetermined column voltage level;

wherein a number of said plurality of switches is increased by said persistent connection exceeding a total number obtained by multiplying together a number of said plurality of row conductors and a number of said plurality of column conductors.

15. The method of scanning a switch matrix in accordance with claim 14, further comprising:

detecting a closure of a first one of said plurality of switches based on a presence of said predetermined column voltage level during monitoring of said plurality of row conductors; and detecting a closure of a second one of said plurality of switches, said detection of said closure of said second one of said plurality of switches being based on a presence of said predetermined row voltage level during monitoring of said plurality of column conductors.

16. The method of scanning a switch matrix in accordance with claim 15, wherein:

said plurality of switches includes a momentary push button.

17. The method of scanning a switch matrix in accordance with claim 15, wherein:

said plurality of switches includes a persistent switch.

18. The method of scanning a switch matrix in accordance with claim 15, wherein:

said plurality of switches includes a momentary push button and a persistent switch.

19. A switch matrix, comprising:

at least one row conductor;

at least one column conductor, wherein each of said at least one row conductor and said at least one column conductor are capable of being driven with a predetermined voltage level, and being capable of being read therefrom a voltage level; and a plurality of switching elements adapted to connect said at least one row conductor to said at least one column conductor, said plurality exceeding a number obtained by multiplying together a number of said at least one row conductor and a number of said at least one column conductor;

a first current path to connect all row conductors and all column conductors, said first current path implemented to allow current to flow bi-directionally therethrough; and a second current path to connect all row conductors and all column conductors, said second current path comprising a diode to allow current to flow only in one direction therethrough.

20. A switch matrix, comprising:

a plurality of row conductors;

a plurality of column conductors, each of said plurality of row conductors and each of said plurality of column conductors are capable of being driven with a predetermined voltage level, and being capable of being read therefrom a voltage level;

a plurality of switching elements including at least one momentary push button adapted to connect at least one of said plurality of row conductors to at least one of said plurality of column conductors;

a first current path to connect all row conductors and all column conductors, said first current path implemented to allow current to flow bi-directionally therethrough; and a second current path to connect all row conductors and all column conductors, said second current path comprising a diode to allow current to flow only in one direction therethrough;

wherein a total number of switching elements of said plurality of switching elements exceeds a product of a total number of row conductors of said plurality of row conductors and a total number of column conductors of said plurality of column conductors; and wherein some of said plurality of switching elements are implemented to allow current to flow bi-directionally therethrough, and others of said plurality of switching elements are restricted to allow current to flow only in one direction therethrough.

21. A method of scanning a switch matrix, comprising:

permitting at least one of a plurality of switches in a first current path connecting all row conductors and all column conductors to allow current to flow bi-directionally therethrough; and restricting with a component within said second current connecting all said row conductors and all said column conductors to allow current to flow only in one direction therethrough;

persistently connecting at least one of a plurality of row conductors to at least one of a plurality of column conductors;

driving one at a time each of said plurality of row conductors with a predetermined row voltage level;

monitoring each of said plurality of column conductors for a given voltage drop corresponding to a closed one of said plurality of switches to a driven one of said plurality of row conductors, while one of said plurality of row conductors is being driven with said predetermined row voltage level;

driving one at a time each of said plurality of column conductors with a predetermined column voltage level; and monitoring each of said plurality of row conductors for a given voltage drop corresponding to a closed one of said plurality of switches to a driven one of said column conductors, while one of said plurality of column conductors is being driven with said predetermined column voltage level;

wherein a number of said plurality of switches is increased by said persistent connection exceeding a total number obtained by multiplying together a number of said plurality of row conductors and a number of said plurality of column conductors.

* * * * *